US006341559B1

(12) United States Patent
Riepenhoff et al.

(10) Patent No.: US 6,341,559 B1
(45) Date of Patent: Jan. 29, 2002

(54) ILLUSTRATION OF A PRINTING FORM FOR WET OFFSET PRINTING

(75) Inventors: Matthias Riepenhoff; Yufan Jiang, both of Bern (DE)

(73) Assignee: Maschinenfabrik WIFAG (CH)

( * ) Notice: Subject to any disclaimer, the term of this patent is extended or adjusted under 35 U.S.C. 154(b) by 0 days.

(21) Appl. No.: 09/527,132

(22) Filed: Mar. 16, 2000

(30) Foreign Application Priority Data

Mar. 17, 1999 (DE) ........................................ 199 11 906

(51) Int. Cl.[7] ............................ B41N 3/08; B41N 3/00; G03F 7/00; G03F 7/004; G03F 7/09

(52) U.S. Cl. ................. 101/453; 101/401.1; 101/463.1; 101/465; 101/467; 101/466; 430/300; 430/302

(58) Field of Search ............................. 101/401.1, 453, 101/463.1, 465, 467, 466; 430/300, 302

(56) References Cited

U.S. PATENT DOCUMENTS 3,615,467 A * 10/1971 Poot ........................... 430/179
5,791,249 A * 8/1998 Quadracci ................ 101/450.1

FOREIGN PATENT DOCUMENTS

DE 39 11 934 C2 8/1995
DE 196 02 328 A1 7/1997
GB 1020648 A * 2/1966 .............. 101/463.1
JP 5-134472 A * 5/1993 .............. 101/463.1
SU 859195 A * 8/1981 .............. 101/463.1

OTHER PUBLICATIONS

1983, Elektronisches Druckverfahren: Videolithografie, 115 Technische Rundschau, vol. 75 (1983) Okt., No. 42, Bern, Schweiz.

* cited by examiner

*Primary Examiner*—Daniel J. Colilla
(74) *Attorney, Agent, or Firm*—McGlew and Tuttle, P.C.

(57) ABSTRACT

A process is provided for a printing form for wet offset printing. A printing style is formed on an ink-transferring surface of the printing form (12) by forming ink-absorbing and ink-repelling areas. For illustration, the ink-transferring surface is wetted with a moistening agent. The areas of the moistened surface that are to be made into ink-absorbing areas are dried in a specific manner, and a material that absorbs printing ink is uniformly applied to the ink-transferring surface with the still dry areas. It is also possible to uniformly apply to the ink-transferring surface first a flowable material that absorbs printing ink, to dry the areas to be made into ink-absorbing areas in a specific manner, and to remove it from the areas to be made into ink-repelling areas by means of moistening agent.

28 Claims, 7 Drawing Sheets

ILLUSTRATION OF A PRINTING FORM FOR WET OFFSET PRINTING

FIELD OF THE INVENTION

The present invention pertains to a process and a device for illustrating a printing form for wet offset printing. The present invention is used especially in newspaper offset printing and preferably in web-fed newspaper offset printing.

BACKGROUND OF THE INVENTION

In newspaper offset printing, the preliminary printing stage has changed greatly as a consequence of the progressive development of computer technology. Operations that were previously carried out manually have been replaced by so-called computer-to technologies. The current stage of development has been reached with computer-to-plate in newspaper printing. The further development is toward computer-to-press, i.e., toward direct illustration in the press.

A printing form cylinder that can be illustrated directly has been known from U.S. Pat. No. 5,293,817. The printing form cylinder has a porous outer jacket. The moistening is performed through the interior of the cylinder through the porous outer jacket. The porosity of the cylinder jacket is between 20% and 45%. The diameter of the pores of the cylinder jacket decreases toward the outside of the cylinder jacket and is between 3 $\mu$m and 100 $\mu$m. The pores of the cylinder jacket communicate with one another. The illustration is performed according to a thermo transfer or ink jet process by means of an image information transfer means. As an alternative, the use of a heated electrode in the form of a pin in order to apply oleophilic material to the cylinder jacket is mentioned.

SUMMARY AND OBJECTS OF THE INVENTION

The object of the present invention is to make possible the illustrating of a printing form in a wet offset printing press in a simple, inexpensive and accurate manner.

According to the invention, a process for illustrating a printing form for wet offset printing is provided, in which a printing style is produced on an ink-transferring surface of the said printing form by forming ink-absorbing and ink-repelling areas. For illustration, the steps are as follows:

a) the ink-transferring surface is wetted with a moistening agent, b) the areas of the moistened surface that are to be made into ink-absorbing areas, are dried in a specific manner, and c) a material that absorbs printing ink is uniformly applied to the ink-transferring surface with the areas still dry.

According to another aspect of the invention, a process for illustrating a printing form for wet offset printing is provided in which a printing style is produced on an ink-transferring surface of the said printing form by forming ink-absorbing and ink-repelling areas. For illustration, the steps are as follows:

a) a flowable material that absorbs printing ink is uniformly applied to the ink-transferring surface, b) the material is cured in a specific manner on the areas that are to be made into ink-absorbing areas, and c) it is removed from the areas that are to be made into ink-repelling areas by means of moistening agent.

According to another aspect of the invention, a device for illustrating a printing form of a rotary printing press for wet offset printing is provided. The device includes a printing form cylinder with the printing form a moistening means for wetting an ink-transferring surface of the said printing form with moistening agent, and an application and image transfer means, with which a printing style with ink-absorbing areas and moistening agent-absorbing areas is produced on the ink-transferring surface by applying a material absorbing printing ink. The application and image transfer means comprises an application means for the uniform application of the material absorbing printing ink over the ink-transferring surface and an image transfer means. The printing style is produced by the uniform application of printing ink-absorbing material by means of the application means and by specific irradiation of the areas of the ink-transferring surface that are to be made into ink-absorbing areas by means of the irradiation means.

The present invention is based on a process for illustrating a printing form for wet offset printing, in which a printing style is produced on a non-illustrated surface of the printing form by preparing ink-absorbing and ink-repelling areas. The surface will hereinafter be called the ink-transferring surface in both the illustrated and non-illustrated state because of its ink transfer function.

According to the present invention, the printing style, i.e., the illustration, is produced by wetting the yet non-illustrated ink-transferring surface with a moistening agent, drying the areas of the moistened surface that are intended to absorb ink in a specific manner, i.e., in the pattern of an image, and subsequently applying material that absorbs printing ink and preferably repels moistening agent to the ink-transferring surface with the still dry areas. Like printing ink itself, the material is repelled by the moistening agent, i.e., it is not transferred to the moist areas. Since the supply of moistening agent preferably takes place uniformly and continuously during the illustration as well, the material is preferably applied as quickly as possible after the drying of the ink-transferring surface, which drying is performed in the pattern of the image, so that the dried areas are not wetted again with moistening agent prior to the application of the ink-absorbing material.

The thickness of a film of moistening agent wetting the ink-transferring surface should be at most 1 $\mu$m, averaged over the area of one image pixel, in order to keep the energy of evaporation low. The thickness is preferably set at a value between 0.2 $\mu$m and 0.5 $\mu$m.

Without leaving the scope of the present invention, the process may be modified such that for illustration, a flowable material is first applied uniformly to the ink-transferring surface, which absorbs printing ink and preferably repels moistening agent, after which this material is specifically cured or is brought to a curing in the areas that are to be made into ink-absorbing areas, and it is removed by means of moistening agent in the areas that are to be made into ink-repelling areas, where it is still flowable.

The said two alternatives of the process have the advantage that the ink-transferring surface is first wetted or covered uniformly, for which moistening water is used in one case and ink-absorbing and moistening agent-repelling material in the other, and the uniformly wetted or covered surface of the printing form is then specifically provided with the printing style by drying the moistening agent or curing, especially by drying in the ink-absorbing/moistening agent-repelling material, where the dried areas or the areas with the cured material form the ink-absorbing areas in the printing style. An applicator, with which an ink-absorbing and moistening agent-repelling material is directly applied in the pattern of an image, is not needed for carrying out the process. By performing only a uniform application of material to produce the printing style in both alternatives of the process, the cost for the applicator for the illustration is markedly reduced.

Uniform application is defined according to the present invention as any application of material for illustration which is not performed in the pattern of an image itself. The material is preferably applied over the entire surface of the printing form or at least in strips of the surface.

The ink-absorbing/moistening agent-repelling material is preferably printing ink, especially printing ink of the current production, in which the illustrated printing form will then be used.

A special advantage of both alternatives of the process according to the present invention is that an ink applicator, e.g., an inking roller, which is present for the current production anyway, can be used to apply the ink-absorbing and preferably moistening agent-repelling material in the course of the illustration. The use of such an ink applicator, especially an inking roller, also corresponds to an especially preferred exemplary embodiment of the present invention. However, it would also be possible to provide a separate applicator roller or another, suitable applicator, e.g., a spray means, for the illustration only or for the illustration and for the subsequent application of the ink. However, the material should not be applied in a controlled manner according to the pattern of an image in the case of such an embodiment, either.

Only the drying of the moistening agent and/or the curing of the ink-absorbing/preferably moistening agent-repelling material is always performed in the pattern of an image. An image transfer means preferably used for this purpose is formed with semiconductor lasers, especially lasers, preferably laser diodes, especially preferably by an array or a plurality of arrays of infrared laser diodes.

The treatment of a material or moistening agent previously applied uniformly to the ink-transferring surface of the printing form, which is performed immaterially and in the pattern of an image according to the present invention, also makes it possible to produce the image more accurately than this is possible by the direct application of material in the pattern of an image.

Furthermore, the present invention pertains to a device for illustrating a printing style in a rotary printing press for wet offset printing. The press is preferably a web-fed rotary printing press for newspaper offset printing. The device comprises a printing form cylinder with the printing form, a moistening means for wetting an ink-transferring surface of the printing form with moistening agent and an application and image transfer means, with which application and image transfer means a printing style with ink-absorbing areas and moistening agent-repelling areas is produced on the ink-transfer surface by applying a material that absorbs printing ink and repels moistening agent.

According to the present invention, the application and image transfer means has an application means for uniformly applying a flowable material that absorbs printing ink and preferably repels moistening agent, and an irradiation means, preferably an exposure device. The printing style is produced by a combination of material application by means of the application means and irradiation of the areas of the ink-transferring surface that are to be made into ink-absorbing areas by means of the irradiation means. The application means is preferably an application means that transfers the printing ink to the printing form cylinder in the current production.

In a large rotary printing press with a plurality of printing form cylinders, such an application and image transfer means is preferably associated with each of these printing form cylinders. The cost advantages of the direct illustration according to the present invention increase with increasing press size, i.e., increasing number of printing form cylinders, especially if the print production is frequently to be changed and down times are to be minimized.

Furthermore, the present invention pertains to a printing form that is permeable to moistening agent and to a process for preparing such a printing form. The printing form is a printing form for a wet offset rotary printing press. The printing form has a surface that can be or is illustrated for transferring printing ink.

The non-illustrated printing form is moistening agent-friendly or it absorbs moistening agent and is preferably hydrophilic at least on an ink-transferring surface. Like prior-art printing forms as well, the printing form may be, e.g., a printing form plate or preferably a printing form shell, which is fastened to a carrier cylinder, e.g., by means of a prior-art clamping device. Such inherently stable printing forms, which can be or are illustrated, are as such also the subject of the present invention. The carrier cylinder forms the printing form cylinder together with the fastened printing form in this case. The printing form may, in principle, also be a cylinder sleeve. However, the drawback of such a printing form sleeve would be that the carrier cylinder would be able to be mounted rotatably on one side only to make it possible to replace the printing form sleeve in a simple manner. Printing form cylinders that have a printing form that can be or already is illustrated on a cylinder jacket surface, in which case the printing form cannot be removed, are also the subject of the present invention; at any rate, the printing form cannot be removed without destruction in this embodiment.

The printing form is permeable to a moistening agent in a radial direction. In the case of a printing plate that is fastened to a carrier cylinder, the direction is indicated relative to the mounted state. The printing form cylinder including the printing form has a means by means of which the moistening agent can be fed to the printing form. The carrier cylinder is defined according to the present invention as the cylinder body of the printing form cylinder on which the printing form is arranged, either as an independent printing plate or, as was described above, as a fixed part. The moistening agent, especially moistening water, is brought from the rear side of the printing form to the ink-transferring surface of the printing form in both embodiments. Since passage channels for the moistening agent open onto the ink-transferring surface because of the radial permeability of the printing form, the moistening of the printing form, i.e., of the ink-transferring surface, and consequently the ink absorption or repulsion can be brought about by specifically closing passage channels on the ink-transferring surface. No moistening agent can reach the ink-transferring surface in the area of closed passage channels, so that ink is absorbed in the area enclosing the passage channel.

Even though the ink-transferring surface can be prepared, in principle, by perforating an initially closed surface, the printing form preferably has an outer material layer that is porous as the printing layer.

The printing form is built up layer by layer according to the present invention and has an outer printing layer with the surface that can be or is illustrated and an adjacent, subjacent sublayer. The flowability (the reciprocal of the flow resistance) through the printing form preferably decreases abruptly several fold according to the present invention at a boundary layer from the sublayer into the printing layer. The resistance to flow increases correspondingly. These two layers may advantageously consist of different materials and they can also be optimally adapted to different functions as a result according to the present invention as well.

Flowability is defined according to the present invention as the volume of the moistening agent used that flows through a layer of a given thickness relative to a pressure difference acting over this layer per unit of time and area, where the area is defined as the outer surface of the layer. The flowability as a material characteristic will hereinafter be related to the non-illustrated state of the ink-transferring surface.

An abrupt reduction according to the present invention is defined not only as a sudden change in flowability, which change can be considered to be discontinuous for practical purposes, but also as a continuous change. In the latter case, the flowability has a steep gradient at the transition from the sublayer into the printing layer. A transition zone from the sublayer into the printing layer, which can never be avoided altogether in practice, and in which the change in flowability according to the present invention takes place, is always thinner than the printing layer. The steepest possible reduction in flowability (an increase in flow resistance) from the sublayer into the printing layer is desirable according to the present invention.

According to a process for preparing such a cylinder, the sublayer is first formed, preferably by a mat made of rustproof metal fibers. Such a mat advantageously has high tensile strength and compressive strength compared with materials of equal porosity. Sintered mats of rustproof metal fibers, rolled to a defined thickness, are especially suitable. Suitable mats have been known from the filter technology applications.

The printing layer is formed by coating the sublayer, preferably by plasma spraying. It is preferably formed by a ceramic layer.

The flow resistance through the sublayer is several times lower than that through the printing layer directly adjacent to it in both the radial direction and the axial and circumferential directions. The flow resistance through it is preferably at least a hundred times and especially at least a thousand times lower than the flow through the printing layer. The sublayer is preferably sealed against the passage of moistening agent at its free edges. The entire printing form is preferably sealed at its free edges.

The flowability through the sublayer is several times higher than that through the printing layer directly adjacent to it in both the radial direction and the axial and circumferential directions. The flowability through it is preferably at least a hundred times and especially at least a thousand times greater than the flowability through the printing layer. The sublayer is preferably sealed against the passage of moistening agent at its free edges. The entire printing form is preferably sealed at its free edges.

Due to the layered structure of the printing form according to the present invention, the resistance to flow or the flow through the printing form as a whole is determined, in a practical approximation, exclusively by the printing layer. The printing layer preferably has a uniform material texture and, at least partly as a result of this, it can be prepared such that it is optimally adapted to the required print fineness. Its structure and texture is such that it is traversed by capillary pores, which are very fine and have a high density by surface on the ink-transferring surface. At least one such capillary pore opens onto the surface per image pixel. The porosity of the printing layer is kept at a low level at the same time. It is preferably below 20%. The porosity is open porosity.

The printing form has the additional advantage that an especially well-defined pressure drop through the layer can be set by means of a single, thin layer, the printing layer, which is uniform in itself With respect to the guiding of moistening agent, the subjacent sublayer has the task of distributing the moistening agent uniformly over the area under the printing layer. The moistening agent level, which is one of the factors determining the overpressure on the rear side of the outer printing layer, is built up in this sublayer. A type of moistening agent lake is formed on the rear side of the outer printing layer due to the design according to the present invention. Thus, the moistening agent presses the printing layer in a particularly uniform manner, so that defined pressure conditions become established on the whole and accurate guiding of moistening agent is possible. Furthermore, the moistening agent pressure is adapted to the particularly required rates of feed of moistening agent to the surface practically without a time lag during acceleration and deceleration phases of the printing form cylinder, e.g., during the speed-up or slowdown of the press.

The printing form is used especially preferably in combination with the illustration process according to the present invention and/or in a device according to the present invention. However, it is not limited hereto, but it may also be used advantageously in combination with prior-art processes and devices for illustrating internally moistened printing forms.

The passage channels of the printing layer, which are preferably the above-mentioned capillary pores, preferably have a mean diameter of 0.1 $\mu$m to 5 $\mu$m, especially measured at the points at which they open onto the ink-transferring surface. The porous printing layer preferably has an average peak-to-valley height Ra in the range of 0.2 $\mu$m to 5 $\mu$m and preferably an average surface roughness Rz in the range of 0.2 $\mu$m to 10 $\mu$m on the ink-transferring surface.

The sublayer is traversed by passage channels, e.g., connected pores, which have a diameter of 10 $\mu$m to 2 mm and preferably 10–50 $\mu$m. The diameter is defined as the diameter of a circle that has the mean cross-sectional area of the passage channels of the layer in question. If it is formed by a mat, the laminar diameter, determined according to ASTM F 902, is the suitable parameter for the characterization. The laminar diameter should be between 10 $\mu$m and 100 $\mu$m.

The thickness of the printing layer in the radial direction is preferably between 50 $\mu$m and 500 $\mu$m, and the thickness of the sublayer is preferably between 500 $\mu$m and 3 mm.

The printing layer preferably has a high absorption coefficient for infrared radiation. The absorption coefficient should be at least 0.9.

Since the moistening agent is preferably evaporated by infrared radiation in the first alternative of the process and there is only a slight absorption of infrared laser radiation, which is preferably used, in the moistening agent film in the near infrared when moistening water is used as the moistening agent, heating and evaporation of a moistening agent take place indirectly by the heating of the printing layer. To achieve an intense local heating of the printing layer, the material selected for the printing layer is preferably a material with a thermal capacity that is lower than the thermal capacity of the moistening agent. The thermal capacity of the printing layer is especially preferably less than 1 J/g. Furthermore, the printing layer is designed such that the thermal conductivity of this layer is markedly lower than the thermal conductivity of the moistening agent. The thermal conductivity is preferably less than 0.2 W/(m·K).

Preferred materials for the printing layer are dark, ceramic materials, e.g., an $Al_2O_3$—$TiO_2$ mixture.

An independent printing form is preferably composed of at least three layers with a printing form carrier, which lets moistening agent through, the sublayer applied thereto, and the printing layer applied to the sublayer. The printing form carrier is preferably made of a metallic material. It may be designed as a flat plate that can be arched or as a preformed shell, especially as a rigid cylindrical half shell. A printing form applied to the carrier cylinder may also have such a multilayer structure.

A perforated printing form carrier has holes with a diameter preferably in the range of 0.5 mm to 5 mm or openings of an equal area, which are arranged in the entire area of the printing form spaced preferably at 5 mm to 50 mm from one another. However, the hole density can be considerably reduced by enlarging the areas per hole and/or by forming a channel structure on the outer surface of the printing form carrier.

The sublayer is applied to the printing form carrier; in particular, it is fastened to it as a whole, preferably glued or bonded by means of a heat-resistant adhesive.

The dry areas on the ink-transferring surface of a printing form that is permeable to moistening agent are preferably obtained by specifically closing the passage channels opening onto the ink-transferring surface.

The amount of moistening agent being discharged on the ink-transferring surface per unit of time is regulated by setting the moistening agent pressure, advantageously by setting the amount of moistening agent in the printing form cylinder. The moistening agent pressure is increased because of the centrifugal forces by increasing the amount of moistening agent on the rear side of the printing form. Furthermore, the rate of feed of the moistening agent to the printing form cylinder is increased and decreased in proportion to the speed of printing.

The amount of moistening agent being discharged on the ink-transferring surface per unit of time, i.e., the rate of flow through the printing form, depends, in an approximation that is fully sufficient for practice, only on the flow through the outer printing layer. The pressure difference over the outer printing layer increases at constant speed of rotation approximately linearly with the moistening agent level that becomes established on the rear side of the printing layer. The flowability through the printing layer can be set only by selecting the thickness of the printing layer, because the printing layer has everywhere an essentially constant porosity and capillary pore density. The sublayer is also homogeneous in this sense. An especially accurate metering of the amount of moistening agent being discharged on the ink-transferring surface can be performed due to the splitting of the function of the uniform distribution of the moistening agent and the setting of the flowability through the printing form. The thickness of the moistening agent film on the surface can be set very accurately, especially at a very low value. At constant cylinder speed, exactly as much moistening agent is fed to the rear side of the printing form as is to be discharged on the ink-transferring surface. The level of equilibrium of the moistening agent level in the sublayer on the rear side of the printing layer will then become established by itself as a function of the speed of rotation of the printing form cylinder. The setting also takes place without a time delay because of the design of the printing form according to the present invention in the case of a change in the speed of rotation.

The overpressure on the rear side of the printing layer shall not exceed 100 mbar. The moistening agent level on the rear side of the printing layer should not exceed the thickness of the sublayer at least at the equilibrium between the intake and the discharge. The thickness of the sublayer and the flowability through the printing layer are correspondingly preferably coordinated with one another.

A preferred possibility of closing is obtained by heat-induced, preferably laser-induced, image-dependent toning. The wet offset printing is known to be based on the repulsion of ink by moistening agent on the moistened areas of the printing form. If the feed of moistening agent is insufficient, ink will also be absorbed in the non-image areas. This operation is generally called toning.

The ink-transferring surface of the printing form is moistened from the inside in this first alternative of the process and it is then dried in an image-dependent manner by means of the image transfer means, preferably by means of infrared lasers. The image areas are dried in this process and are inked immediately thereafter. During inking, the ink is transferred onto the dried areas, while the moist areas remain ink-free. The ink clogs the passage channels in the dried areas, so that no more moistening agent can reach the ink-transferring surface in these areas.

In the second alternative of the process, the printing form is heated in an image-dependent manner by means of the image transfer means after the inking. The ink dries in the heated areas and consequently also in the passage channels and at the mouths of the passage channels. The ink having dried in the passage channels can no longer be displaced during the subsequent supply of moistening agent, while the flowable ink is displaced by the moistening agent. The moistening agent pressure may be slightly increased compared with the moistening agent pressure in the production until the free running of the printing form.

The illustration of the printing form, i.e., the ink having dried in the passage channels, can be removed by a prior-art printing form-washing means and/or by the inner moistening with a moistening agent pressure that is increased compared with that prevailing during the production.

As an alternative to the above-mentioned closing by means of ink, a monomer or a mixture of monomers may also be applied, especially sprayed, onto the ink-transferring surface of the printing form in a subvariant of the second alternative of the process. Polymerization is induced by means of the image transfer means. The plastic formed in the process closes the passage channels, e.g., by forming polystyrene from styrene under the effect of heat. The closed pores can be freed again by repeated heating by decomposing the polymer and removing it by supplying moistening agent. The moistening agent is fed in preferably from the inside during the erasing of the image. However, washing from the outside is also possible and it especially supports this process.

In an exposure process for illustrating the printing form, the printing form and an image transfer means perform a relative movement, whose direction and velocity are preset, and during which the surface of the printing form to be illustrated is exposed pixel by pixel in the pattern of an image. As in prior-art printing forms, the pixels of the printing style to be produced are also arranged in columns and lines at right angles thereto on the ink-transferring surface of the printing form. Consequently, a pixel column extends in the direction of the column and a pixel line extends in a line direction that is at right angles thereto. The above-mentioned relative movement takes place either in the direction of the column or in the direction of the line. If the printing form is the printing form of a printing form cylinder in a rotary printing press, the direction of the column is the direction of printing and the direction of the line is the longitudinal direction of the cylinder. In the case of illustration in the press, the direction of the relative movement, to which the width and length data of the light-emitting areas are related, is the direction of printing. However, illustration of a printing form outside a press is also conceivable, in which case illustration can also be performed in the direction of the line as the standard direction of the relative movement.

The strip-like laser spot may advantageously also be used for the especially fine setting of the surface coverage and consequently the tonality steps without changing the geometry of an optical imaging means for focusing the laser light on the ink-transferring surface. By changing, especially reducing, the on time of the semiconductor lasers, pixels of any extension in the direction of the relative movement can be produced. In particular, it is possible to produce pixels that have very small areas, but are not square, but strip-shaped. The number of gray scales, which can be represented, is known to be obtained from the screen width and the pixel area. As a general rule, the screen cell width is equal to the reciprocal value of the screen width. The area of the screen cell is calculated from this by squaring. The maximum number of tonalities that can be represented is obtained by dividing the result by the pixel area. Thus, a screen cell has an area of 250×250 $\mu m^2$ in the case of, e.g., a 40 screen. A maximum of 16 gray scales can be represented in the case of a pixel width of 62 $\mu$m in case of square pixels. If rectangular pixels of 62 $\mu$m×31 $\mu$m are produced, there already are 32 gray scales. The illustration time is the same in both cases. The finer graduation of the gray scales makes it possible to better compensate nonlinearities occurring in the print, such as increase and decreases in tonality, than it is possible with laser spots, which have a very short extension according to the present invention in the direction of the relative movement. If the printing form is arranged on a printing form cylinder, an angle transmitter for the printing form cylinder or for an associated rubber blanket cylinder has a correspondingly higher resolution for this compensation, or intermediate increments are formed with an electronic unit by interpolation.

The image transfer means preferably comprises an array or a plurality of arrays of pulsed or current-pumped semiconductor lasers, especially pulsed infrared lasers, especially preferably laser diodes. Narrow, strip-like, preferably rectangular laser spots are produced by means of the lasers on the surface to be illustrated, and the width of these laser spots, measured in the direction of the relative movement on the surface to be illustrated, is several times smaller than a width of an image pixel of the surface to be illustrated, which latter width is measured in the same direction, and it is also several times smaller than a laser spot length measured at right angles to the laser spot width. A pulse time per laser spot is now several times longer than a period during which a section that corresponds to the laser spot width is covered during the relative movement between the printing form and the laser array.

In a preferred embodiment, the illustration is performed in the press directly on the printing form cylinder. The relative movement between the printing form and the laser array is brought about in this case by a vertical movement by rotating the printing form cylinder and a horizontal movement directed at right angles hereto by shifting the laser array. The image information is transferred column by column to the printing form during the rotation of the printing form cylinder. Columns located next to one another are illustrated one after another due to the horizontal shift of the laser array until the entire image has been recorded. The laser spots produced on the ink-transferring surface of the printing form by means of the lasers now have a width measured in the vertical direction and a length measured in the horizontal direction. The horizontal movement of the laser array during the illustration preferably takes place continuously with the printing form cylinder rotating. Optimally short illustration times can thus be obtained.

The resolution of the exposure device depends on the section by which the laser array is shifted during one revolution of the cylinder. This section is preferably between 84 $\mu$m and 28 $\mu$m. This corresponds to a preferred resolution of 300 to 900 dpi. The laser spot length is preferably 30 $\mu$m to 90 $\mu$m and the laser spot width is preferably 1 $\mu$m to 10 $\mu$m. The laser pulse time is between 1 $\mu$sec and 50 $\mu$sec, depending on the resolution of the device, the output of the semiconductor laser, and the speed of illustration. The illustration is performed by the axial shift of the array, of which there is at least one, along the printing form cylinder, which is rotating during the illustration. The overall laser array may be formed by replaceable modules with, e.g., 64 diodes per printing zone.

The ratio of the laser spot length to the laser spot width is preferably at least 10:1 and especially preferably at least 20:1.

One advantage of the image transfer means according to the present invention is that a mechanically accurate adjustment is not necessary. Software adjustment is preferably performed.

The image transfer means preferably comprises an array or a plurality of arrays of, e.g., 256 semiconductor lasers in 4 arrays with 64 lasers each for one printing zone.

Semiconductor lasers with narrow, strip-like, preferably rectangular light-emitting areas, which are characteristic especially of infrared laser diodes, are used to produce a narrow, strip-like laser spot. The emitted laser light is focused on the ink-transferring surface by means of an optical imaging means. The laser output can be kept at a low level due to the preferred elongated strip shape of the laser spot, the use of a simple optical system, which is made possible hereby, in conjunction with the correspondingly narrow strip shape of the light-emitting areas and the long pulse time per image pixel. The energy consumption is also lower despite the longer pulse time than in the case of a laser spot produced directly or approximately in the pattern of the image pixel of the printing style to be produced on the ink-transferring surface.

The image transfer means correspondingly comprises pulsed or current-pumped semiconductor lasers, especially infrared lasers, especially preferably infrared laser diodes, with light-emitting, strip-like areas, whose width, measured in the direction of the relative movement, is several times smaller than a width of an image pixel on the surface to be illustrated, which latter width is measured in the same direction, and it is also several times smaller than a length of the light-emitting area.

The lasers preferably emit in the infrared or visible range, especially in the wavelength range of 700–1,400 nm.

An optical imaging means, preferably with at least one lens per light-emitting area, is provided for the light-emitting areas. The lenses of the imaging means are preferably arranged in the form of one or more arrays, advantageously as one or more lens arrays made of plastic, which can be mass-produced at low cost and are easy to mount. The lasers are fastened in or on a housing in such an orientation in relation to one another that their light-emitting areas have parallel longitudinal directions. Finally, the image transfer means comprises a triggering electronic unit, with which the lasers are triggered such that one laser pulse time is several times longer than the period during which a section that corresponds to the width of the light-emitting area is covered during the relative movement.

The exposure device does not need a fiber output. This also makes the device inexpensive and increases its efficiency. A laser carrier of the image transfer means is preferably water-cooled.

A triggering electronic unit for the image transfer means preferably comprises sufficient storage capacity for two bit maps, namely, one bit map for a current image and the second bit map, of which there is at least one, for a next image. Furthermore, the triggering electronic unit comprises a power electronic unit for each of the lasers. The triggering electronic unit is coupled with a position transmitter of the printing form cylinder, from which it receives the rotation angle position of the printing form cylinder and the position of the array, preferably of each array module, in order to synchronize the laser pulses with the movement of the printing form cylinder. The triggering electronic unit is coupled with a server PC for data transmission.

While the current image is being printed, the new image can be loaded into the memory of the triggering electronic unit. The new image is thus available for the next production within the triggering electronic unit during the current production. After the illustration of the printing form, but at the latest after the end of the current production, the memory of the old image is made free and it can take over the data for the production after next. The memory of the new image becomes the memory of the current image for the next production and the memory of the image that was previously the current image becomes the memory for the new image. The triggering electronic unit is preferably an integral part of the image transfer means directly at the site of the laser array; it is preferably moved along.

At the level of the press, the server computer or a plurality of server computers receives/receive the separated image data, which have been converted into the half-tone dots, in the form of bit maps. One or more printing couples of the press are associated with each server. The data transmission to the triggering electronic unit takes place via a high-speed local network.

The image transfer means, especially its arrangement in the printing press, the design of one or more laser arrays, the assignment and the mode of action of the triggering electronic unit, as well as the division of the tasks between the server and the triggering electronic unit can be advantageously used universally and are not bound to the conduct of the illustration process specified in the claims or to the device used for this purpose, even though the image transfer means is preferably used in this illustration and especially preferably in combination with this illustration and the above-described printing form.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF TEE DRAWINGS

DESCRIPTION OF THE PREFERRED EMBODIMENTS

Figure 1:
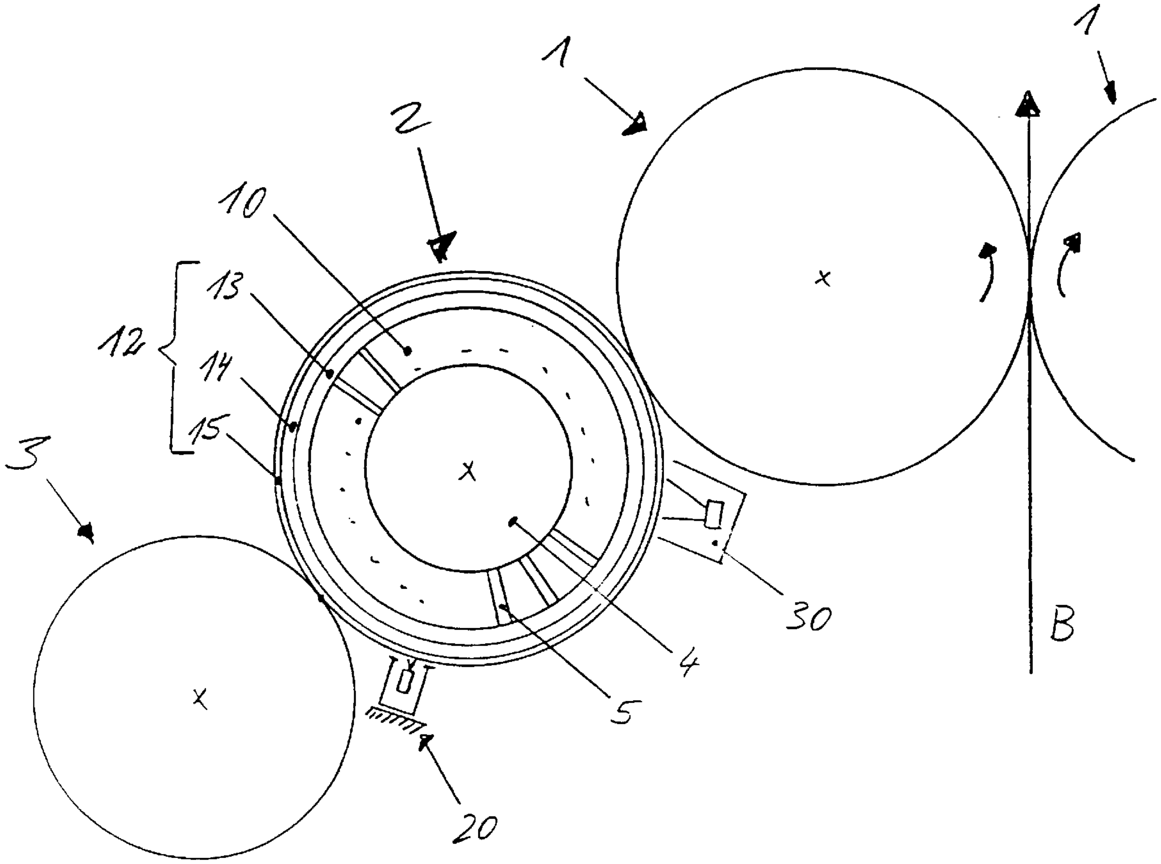
FIG. 1 is a schematic partially sectional view showing a cylinder and roller arrangement with a printing form cylinder according to a first exemplary embodiment of the invention.

Referring to the drawings in particular, in FIG. 1, a printed web B is led through between two rubber blanket cylinders 1 and is printed on both sides in the printing gap formed between the two rubber blanket cylinders 1. A printing form cylinder 2 each is associated with the two rubber blanket cylinders 1 in the manner shown for the left-hand rubber blanket cylinder 1. An inking roller 3 is also shown for the left-hand rubber blanket cylinder 1. The arrangement of the cylinders and rollers is mirror symmetrical on both sides of the web B. The arrangement shown in FIG. 1 is preferably repeated for each of the many rubber blanket cylinders of the printing press.

The exemplary embodiment pertains to a web-fed rotary newspaper offset press with rubber-rubber production, e.g., a WIFAG OF 370. However, the press may also be a machine for rubber-steel production, e.g., with one or two central steel cylinders and rubber blanket cylinders forming printing gaps therewith per printing couple, e.g., a WIFAG OF 470 or OF 790.

The ink is transferred from the inking roller 3 to the printing form cylinder 2 and from the printing form cylinder 2 to the rubber blanket cylinder 1, which prints the image received from the printing form cylinder 2 on the web B in the printing gap.

The printing form cylinder 2 has a hollow cylindrical carrier cylinder 10 with a central, axial hollow space 4, which is in fluid connection with a moistening agent feed means. The fluid connection is formed by a revolving joint at one or both shaft journals of the printing form cylinder 2. The moistening agent is fed into the hollow space 4 through this shaft journal. The moistening agent is first filtered in order to avoid disturbing deposits within a printing form 12. The carrier cylinder 10 has passage channels 5 in the radial direction. The passage channels 5 are designed as straight, exactly radial holes 5. Each of the holes 5 has a diameter of 6 mm in the exemplary embodiment. The holes 5 open onto an outer jacket of the carrier cylinder 10 at a distance of 20 mm from one another, measured between the centers of the holes.

The outer jacket of the carrier cylinder 10 is surrounded by perforated steel plates arranged in layers one on top of another in a shell-like pattern. The steel plates form a perforated printing form carrier 13 of the printing form 12, which is continuously connected to the carrier cylinder 10. Four perforated steel plates are arranged in layers one on top of another to form such a printing form carrier 13 in the exemplary embodiment. However, the sublayer 14 could also be fastened directly to the carrier cylinder.

To form the printing form 12, a sublayer 14, which in turn acts as a carrier for a printing layer 15, is bonded to the printing form carrier 13. The printing layer 15 forms the ink-transferring surface of the printing form cylinder 2 on its free outer surface. The printing layer 15 and the sublayer 14 are porous.

Moistening agent is injected into the hollow space 4 of the printing form cylinder 2. Due to the centrifugal force, the moistening agent is fed to the rear side of the sublayer 14 through the holes 5 of the carrier cylinder 10 and the perforated printing form carrier 13 acting as a distributor. The moistening agent reaches the ink-transferring surface through the sublayer 14 and the printing layer 15 and causes that no printing ink will be absorbed on the wetted areas.

Water, which is provided with the additives usually used in offset printing, is used as the moistening agent.

The printing form cylinder 2 is associated with an image transfer means 20. The image transfer means 20 comprises infrared laser diodes, which are directed toward the surface of the printing form cylinder 2. The image transfer means is arranged such that the printing form cylinder 2 passes by the image transfer means 20 during its rotation as shortly as possible before reaching the contact point with the inking roller 3.

Furthermore, a washing means 30, which is arranged in the exemplary embodiment behind the rubber blanket cylinder 1 and in front of the image transfer means 20 when viewed in the direction of rotation, is associated with the printing form cylinder 2. Ink can be wiped off from the surface of the printing form cylinder 2 by means of the washing means 30.

Figure 2:
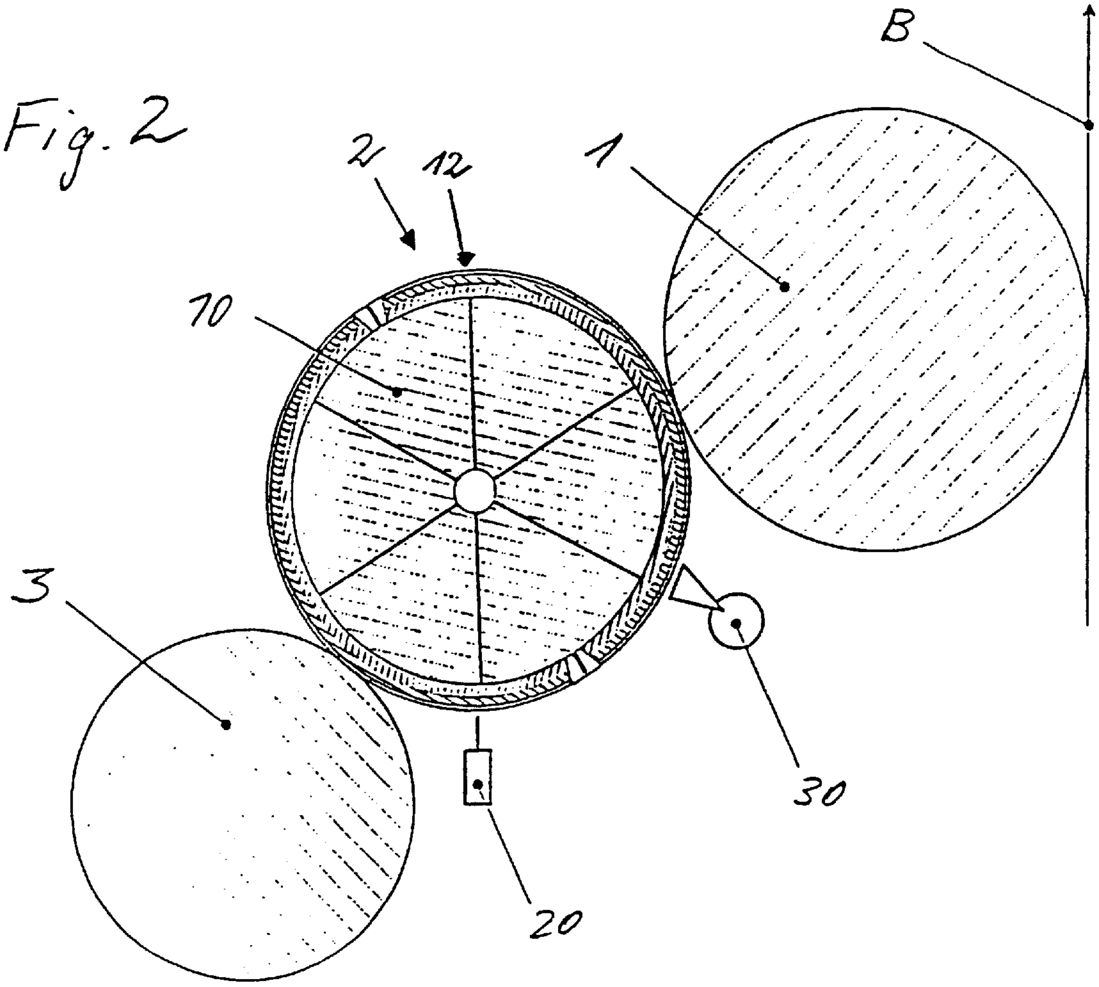
FIG. 2 is a schematic partially sectional view showing a cylinder and roller arrangement with a printing form cylinder according to a second exemplary embodiment of the invention.

FIG. 2 shows the cross section of the printing form cylinder 2 with two printing forms 12, which are designed independently, and are detachably fastened to a carrier cylinder 10 of the printing form cylinder 2 by means of a prior-art clamping device 6.

The carrier cylinder 10 corresponds essentially to the carrier cylinder 10 of the first exemplary embodiment. However, the central, axial feed channel or hollow space 4 has a substantially smaller diameter. The channels 5 branched off radially are correspondingly longer than those of the first exemplary embodiment. The radial distribution channels 5 open into axial distribution channels, which are recessed on the outer jacket surface of the carrier cylinder 10 in order to make the distribution of the moistening agent uniform as early as possible.

The arrangement of the printing form cylinder 2 according to FIG. 2 in a printing press corresponds to that in the first exemplary embodiment, so that both exemplary embodiments will always be referred to in connection with the illustration and all further details and features of the present invention.

Figure 3:
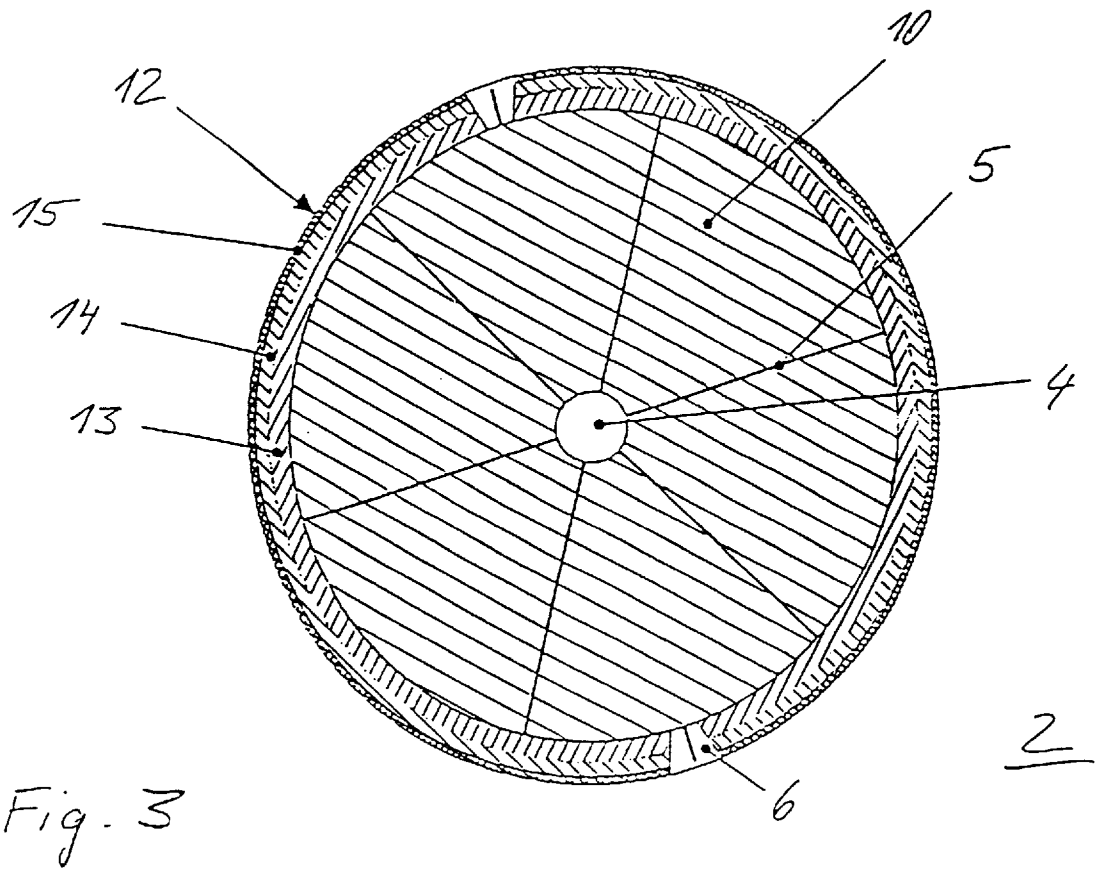
FIG. 3 is a schematic partially sectional view showing the printing form cylinder according to FIG. 2.
Figure 4:
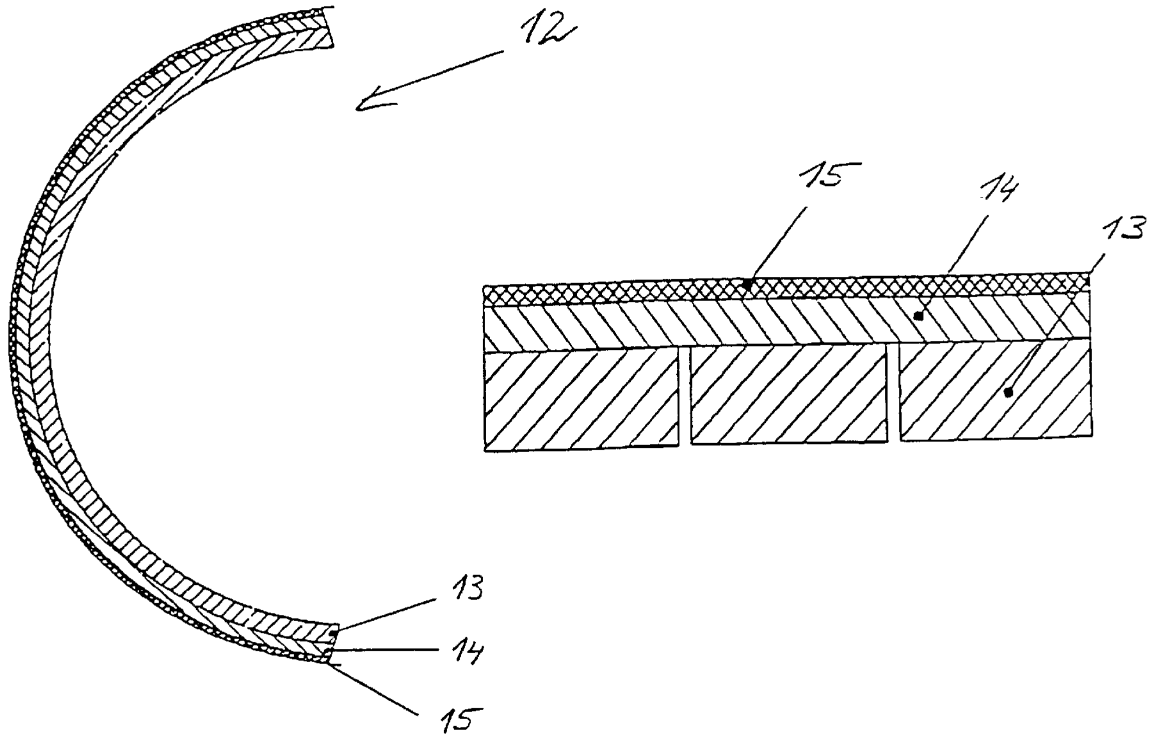
FIG. 4 is a schematic partially sectional view showing shows the printing form of the printing form cylinder according to FIG. 3.

One of the two printing forms 12 of the second exemplary embodiment is shown individually in FIG. 3. The printing form 12 is formed, in the manner already described in connection with the first exemplary embodiment, by a perforated printing form carrier 13, a porous sublayer 14 applied thereto, and a porous printing layer 15 arranged over the latter. The printing form carrier 13 is formed by a single, semicylindrical steel plate with uniform perforation.

The porous sublayer 14 is formed by a mat made of steel fibers, whose fibers are matted into so-called matted fibers. After matting, the mat is sintered together with a wire cloth under vacuum and rolled to a defined thickness, namely, the layer thickness in the printing form 12. Due to the very high porosity of the steel fiber mat, preferably greater than 60%, the sum of pore cross sections is extremely high compared with the percentage of material. Compared with the particle size spectrum of powders,the diameter range of the fibers is very uniform, so that the pore size distribution is very narrow as well. The desired properties in terms of high flowability and low pressure drop through the sublayer 14 are thus obtained. Furthermore, the pores of the mat have a stable shape due to the sintering process.

The steel fiber mat is bonded to the printing form carrier 13 by means of a heat-resistant adhesive. The sublayer 14 is coated with the printing layer 15 by plasma injection molding, preferably under vacuum. The printing layer 15 is a ceramic layer in the exemplary embodiment.

Preferred materials and parameters for printing forms according to the present invention, especially for the printing forms 12 of the exemplary embodiments, are listed in the following tables. Even though a three-layer structure is preferred, a structure comprising more than three layers as well as a structure comprising only two layers are also the subject of the present invention. Particularly preferred parameters and their ranges are indicated in the second columns. The particular layer does not have to meet all specified values at the same time, even though it preferably does.

TABLE 1

| Printing Layer 15 | | |
|---|---|---|
| Material | Hydrophilic, e.g., $TiO_2$—$Al_2O_3$ mixtures, as they are used in coating | plasma |
| Thickness | 50–500 μm | 100–200 μm |
| Capillary pore diameter | 0.1–5 μm | 0.1–3 μm |
| Open porosity | 3–30% | <20% |
| Rz | 0.2–10 μm | 1–5 μm |
| Ra | 0.2–5 μm | |
| Flowability | 2–20 L/(h $m^2$ mbar) | |

TABLE 2

| Sublayer 14 | | |
|---|---|---|
| Material | Mat made of rustproof metal fibers, sintered with wire cloth and subsequently rolled | |
| Thickness | 0.5–3 mm | 0.5–2 mm |
| Laminar diameter | 10–100 μm | 10–60 μm |
| Porosity | 50–80% | >60% |
| Flowability | 1,000–40,000 L/(h $m^2$ mbar) | |

TABLE 3

| Printing form Carrier 13 | | |
|---|---|---|
| Material | Stainless steel, one piece or coated steel plates | |
| Thickness | 1–5 mm | |
| Hole diameter | 0.5–5 mm | |
| Hole spacing | 2–50 mm | 5–50 mm |
| Flowability | ≧200 L/(h$m^2$mbar) | 200–20,000 L/(h $m^2$ mbar) |

The flowability of moistening agent through the printing form 12 relative to the nonillustrated state has a value that is in the range of 2–20 L/(h $m^2$ mbar). In an approximation that is sufficient for practical purposes, it also corresponds to the value of the flowability through the printing layer 15.

The homogeneous distribution of the moistening agent in the sublayer 14 and consequently on the rear side of the printing layer 15 is achieved due to the high, isotropic flow through the sublayer 14.

The values and their ranges, which are given above and also in the tables for the flowability are related to moistening water as the moistening agent. However, they also apply to other suitable moistening agents having the same or similar flow properties. Furthermore, the values given for the flowability are related to the nonillustrated state of the printing form.

To bring about flow, the moistening agent must be supplied under a pressure that overcomes the resistance to flow of the individual layers, especially the capillary pressure of the fine-pored printing layer 15. This pressure is generated by the centrifugal forces acting on the moistening agent during the rotation of the printing form cylinder 2. The pressure difference increases approximately linearly with the water level that becomes established on the rear side of the printing form, i.e., in a good practical approximation, on the rear side of the printing layer 15.

Since the pressure difference occurs mainly on the printing layer 15, because the resistance to flow is highest there, the sublayer 14 will be subject to tensile load. This load should be low for reasons of strength. It can be recognized from known relationships between the centrifugal force, the cylinder radius, the circumference of the cylinder, the speed of rotation and the surface velocity that the tensile load of the sublayer decreases with increasing radius at constant surface velocity. The present invention is therefore particularly advantageous if cylinders with large radius are used, as in the case of, e.g., newspaper printing presses with double circumference. The own weight of the printing layer 15 should not be ignored, either. However, compared with the moistening agent lake present in the sublayer 14, which has a depth of, e.g., 1 mm, the weight of the printing layer 15 is small because of its smaller thickness of, e.g., 100 $\mu$m. It can also be recognized from the same considerations that the use of a thick printing layer would be less advantageous. It would be necessary in such a case either to use a highly porous material or a material with large pores, which would have an unfavorable effect on the strength of the printing layer as well as the quality of the print, or to produce a high overpressure on the rear side of a thick printing layer, which requires cylinders with very small radii and consequently high centrifugal forces at constant cylinder speed, or the feed of moistening agent under pressure, which would, however, lead to problems concerning sealing during the introduction of the moistening agent into the rotating cylinder.

At a level of 0.1 mm, the pressure of the moistening agent on the rear side of the printing layer 15 due to the centrifugal forces is about 0.55 mbar at a speed of rotation of 36,000 revolutions per hour and a cylinder radius of 200 mm. The maximum pressure difference over the printing form 12 should not exceed 100 mbar. Since a correspondingly smaller amount of moistening agent must and should be present on the ink-transferring surface at reduced press speed, the pressure can decrease with decreasing speed, especially linearly. The moistening agent level on the rear side of the printing layer 15 must not exceed the thickness of the subjacent layers. In the case of, e.g., a three-layer printing form 12, it should be at most as high as the thickness of the sublayer 14. A pressure difference of about 0.45 mbar is obtained on the rear side of the printing layer 15 at a moistening agent level of 3 mm for the hypothetical cylinder radius of 200 mm at a speed of rotation of 5,000 revolutions per hour. This overpressure, which is eliminated through the printing layer 15, should be higher than the pressure difference that is necessary for a sufficient flow through the printing layer 15. The printing layer 15 should consequently have a material structure that is sufficient for the sufficient supply of the ink-transferring surface with moistening agent at least at the maximum pressure difference arising from the thickness of the sublayer 14, so that printing is possible at low speed of rotation as well.

Calculation examples for describing the dependence of the moistening agent pressure on the speed of the cylinder and the moistening agent level on the rear side of the printing layer 15 are shown in the table below:

| Speed of rotation [rev. per hour] | Moistening agent level [mm] | Hydrostatic pressure [mbar] |
|---|---|---|
| 36,000 | 1 | 5.53 |
| 36,000 | 0.5 | 2.76 |
| 36,000 | 0.1 | 0.55 |
| 20,000 | 1 | 1.71 |
| 20,000 | 0.5 | 0.85 |
| 20,000 | 0.1 | 0.17 |
| 5,000 | 2 | 0.21 |
| 5,000 | 1 | 0.11 |
| 5,000 | 0.5 | 0.05 |

Basis of the calculation: Cylinder radius: 200 mm, porosity of sublayer: 70%, moistening water.

The effect of the force of gravity increases with decreasing speed of rotation and it must therefore be taken into account. The centrifugal force generates a pressure difference of about 0.2 mbar on the rear side of the printing layer 15 at a moistening agent level of 2 mm for the hypothetical cylinder radius of 200 mm at a speed of rotation of 5,000 revolutions per hour. The centrifugal force consequently still exceeds the force of gravity by about 30%. The variations in the moistening agent pressure are advantageously equalized by the capillary effect of the small pores in the printing layer 15. Uniform wetting of the outside of the printing layer 15 is therefore also achieved at low speeds. The mean hydrostatic pressure acting on the rear side of the printing layer 15 due to gravitation is 1 mbar per 10 mm of moistening agent level x porosity of the sublayer 14. The gravitation pressure on the rear side of the printing layer 15 is greater than the pressure generated by the centrifugal forces at a cylinder speed of about 4,500 revolutions per hour or lower. The moistening agent therefore flows downward and causes a rise in the moistening agent level in the subjacent area of the sublayer 14. Moistening agent is forced back there into the printing form carrier 13. Thus, not only the gravitation pressure, but also the centrifugal force increase ion the lower area of the printing form cylinder 2. Thus, moistening of at least the lower area of the cylinder should be possible at low speeds as well.

Based on the relationships explained above, the image transfer means 20 is preferably arranged facing the lower area of the printing form cylinder 2. Accurate illustration of the printing form 12 is possible as a result even in the low speed range of the cylinder. A lower limit for the speed of rotation of the cylinder during illustration is about 3,000 revolutions per hour in the case of newspaper offset printing with two printing forms 12 per printing form cylinder 2.

If the centrifugal forces acting on the printing form 12 are taken into account, the strongest force acts on the brackets of the printing form 12 with which the printing form 12 is fastened in the clamping device 6 of the printing form cylinder 2. Furthermore, a force also acts on the glued or bonded connection between the sublayer 14 and the printing form carrier 13. A weaker force acts on the connection area between the printing layer 15 and the sublayer 14. The following values are obtained per printing form 12 for a printing form cylinder 2 with a radius of 200 mm at a speed of rotation of 36,000 revolutions per hour and a printing form 12 with a surface of 400 mm×600 mm:

| | Weight | Centrifugal force |
|---|---|---|
| Printing form carrier 13: | | |
| Steel half shell with a thickness of 5 mm | 9.6 kg | 7.6 kN |
| Sublayer 14: | | |
| 2-mm pad, 70% porosity | 1.2 kg | 947 N |
| Moistening agent lake in sublayer 14: | | |
| 1 mm deep | 170 g | 134 N |
| Printing layer 15: | | |
| 100 $\mu$m thick, ceramic | 50 g | 40 N |

A total force of about 8.7 kN, which must be absorbed by the brackets of the printing form 12, is obtained in this calculation example. A force of 1.121 N acts on the glued or bonded connection between the printing form carrier 13 and the sublayer 14. This corresponds to a tensile load of 5 mN/mm$^2$. The fibers of the sublayer 14 are loaded with about 1 mN/mm$^2$ at the connection to the printing layer 15. This corresponds to a pressure of 10 mbar. Higher pressures are generated as the depth of the moistening agent lake or the speed of rotation increases.

In a first alternative of the illustration process, the image transfer means 20 evaporates the moistening agent on the surface. To illustrate a still "virgin" printing form, the moistening agent wetting the surface is evaporated by means of the image transfer means 20 corresponding to the image to be transferred to the rubber blanket cylinder 1. Before an area from which surface-moistening agent was just evaporated by means of the image transfer means 20 is again moistened because of the entry of more moistening agent, the dried area passes by the inking roller 3 and absorbs ink. A pore that opens into the surface area just dried is closed by the ink absorbed in that area, so that no more moistening agent reaches the now printing opening area.

Instead of evaporating moistening agent, the image transfer means 20 may also be used to specifically dry ink already applied with the inking roller 3 on the ink-transferring surface of the printing form cylinder 2 in the pattern of an image in order to thus close the pores of the printing layer 15 located under the dried inked areas. In this alternative of the process, ink is uniformly applied to the still dry surface of the printing form cylinder 2 by means of the inking roller 3. The supply of moistening agent to the printing form cylinder 2 is preferably started only when the ink has already been uniformly applied. After the uniform application of the ink, the still flowable ink is dried in the image areas of the ink-transferring surface by means of the image transfer means 20. The pores are closed in the image areas by ink having dried in. The image areas of the ink-transferring surface thus do not run free from the inside in the course of the beginning or progressing moistening. However, the printing form 12 runs free in the non-image areas as the moistening progresses.

The same arrangement shown in the figures may be used in both alternatives of the process, the induced toning and the ink drying. In the second alternative of the process, the drying of the printing ink, arranging the image transfer means behind the inking roller may also be advantageous.

The illustration can be erased in both alternatives of the process by washing off the ink layer by means of the washing means 30.

It is also possible with the same image transfer means 20 to polymerize a monomer sprayed onto the ink-transferring surface of the printing form cylinder 2 and to close the pores in the ink-transferring surface as a result. The illustration can again be erased by repeated heating after the end of a print production by means of the same image transfer means 20 and removing the polymer decomposed by the heating, by means of the moistening agent. The monomer may already have been applied to the ink-transfer-ring surface of the printing form. However, an applicator, especially a spraying device for spraying on the monomer, is preferably arranged on the spot at the site of installation of the printing form cylinder 2, so that repeated illustration is also possible especially with this variant of the second alternative of the process without having to remove the printing form 12 or the printing form cylinder 2.

Figures 5A, 5B, 6:
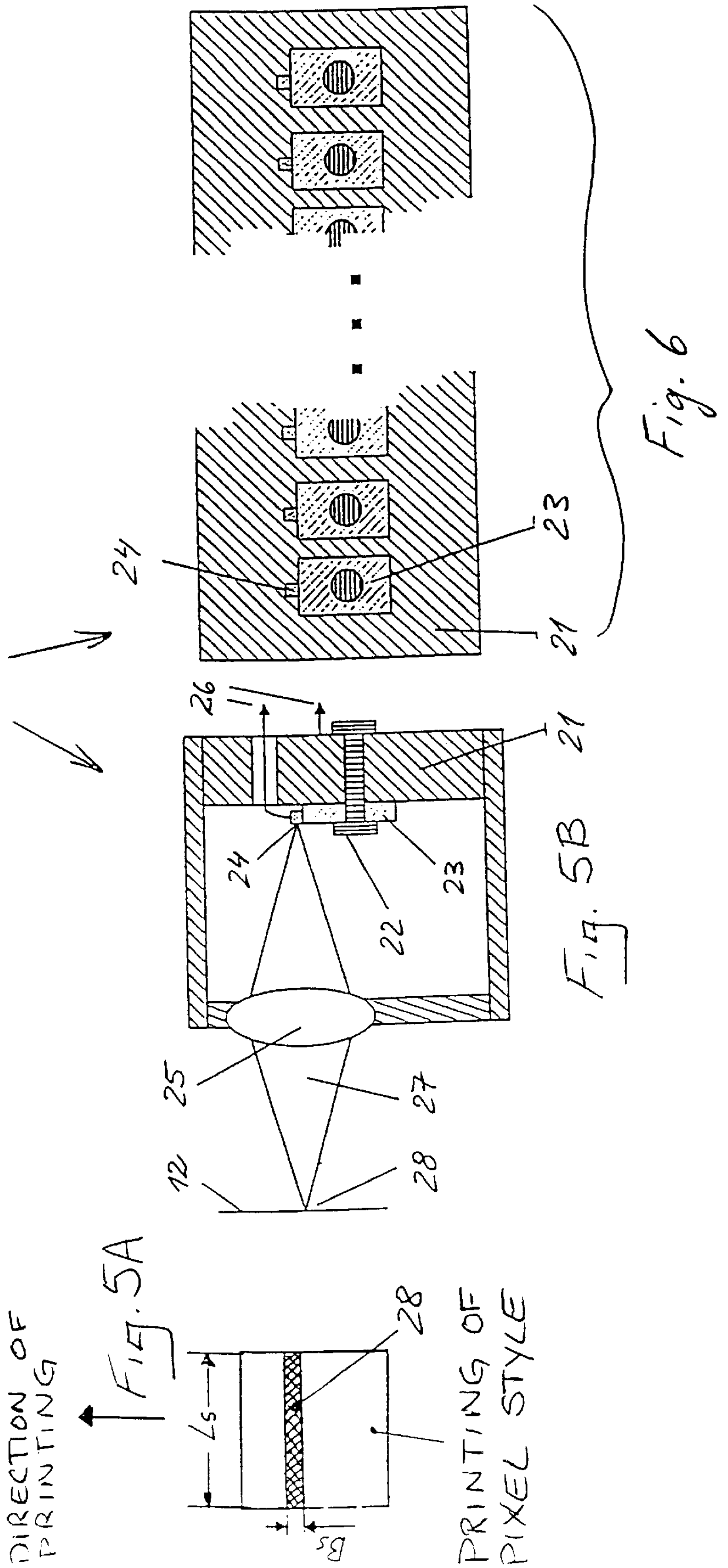
FIG. 5A is a view showing the laser spot falling on the printing form.
FIG. 5B is sectional view through an exposure device of an image transfer means.
FIG. 6 is another sectional view, partially broken away, through the exposure device.

FIG. 5 shows the cross section of the exposure device of the image transfer means 20. FIG. 6 shows a longitudinal section of the exposure device. The exposure device may also be designated with the reference number 20 instead of the entire image transfer means.

The exposure device 20 is formed by infrared laser diodes arranged in a line next to one another, which are fastened in a housing 21 with a fastening means 22 each. Each of the laser diodes is formed by a laser chip 23 with a light-emitting area 24. Opposite the light-emitting areas 24, the housing 21 is provided with an overlapping row of holes. Optical lenses 25 are arranged in the overlapping holes of the row of holes. Each laser chip 23 has an electric connection 26 to a triggering electronic unit.

As can be recognized from FIG. 5, a beam 27 emitted by the light-emitting area 24 of one of the laser chips 23 is bundled by the opposite lens 25 to the ink-transferring surface of the printing form 12 of the printing form cylinder 2, so that it falls on that surface as a narrow rectangular laser spot 28. The shape of the light-emitting area 24 corresponds to the laser spot 28 generated by it. It preferably also has the same size. However, enlargement or reduction to a certain extent may sometimes also be advantageous in practice.

A single pixel of the printing style to be produced is shown in a greatly enlarged form to the left of the exposure device 20. The laser spot 28 in the pixel of the printing style is also shown. The length Ls of the laser spot 28 measured in the longitudinal direction of the cylinder corresponds to the length of the individual pixel of the printing style, measured in the same direction. The width Bs of the laser spot 28, measured in the direction of printing, is several times smaller than the width of the pixel of the printing style, measured in the same direction. In the exemplary embodiment, the pixel of the printing style is square with a length and width of 50 $\mu$m each. The laser spot length Ls is likewise 50 $\mu$m. In contrast, the laser spot width Bs is 3 $\mu$m. The exposure time or pulse time of the pulsed laser diodes 24 is correspondingly long for exposing the pixel of the printing style. The on time for the exposure of one square pixel, which has an edge length that corresponds to the laser spot length Ls, is obtained from the quotient of the laser spot length Ls and the surface velocity of the printing form 12.

Sixty-four laser diodes 23 are arranged in a line in the housing 21. Such an array with 64 laser diodes, which, distributed uniformly, are arranged over a length just under one side width, is provided per side width. Four such arrays are arranged in a line next to one another in the case of a printing unit with a width of 1.8 m.

The illustration takes place at a speed of about 10,000 revolutions per hour of the printing form cylinder 2, and each of the arrays is continuously shifted in its side area in the longitudinal direction of the cylinder during the rotation of the cylinder. A stepwise shift by one pixel column after each full revolution would also be possible, but more time-consuming. The amount by which the laser array—and all these laser arrays in the case of a plurality of laser arrays—is horizontally shifted per revolution of the cylinder corresponds to the reciprocal value of the image resolution. At an image resolution of, e.g., 500 dpi, the laser array is shifted by 51 $\mu$m per revolution of the cylinder at right angles to the direction of printing. The laser spot length Ls must not be smaller than the resolution-related feed of the laser array in order to expose full areas. The maximum resolution is determined by a rotation angle transmitter and the circumference of the printing form cylinder 2. The rotation angle transmitter is an incremental transmitter, which is arranged either at the printing form cylinder 2 or the associated rubber blanket cylinder 1 and measures the rotation angle position of the cylinder. At a resolution of 40,000 steps per revolution of the cylinder and a printing form cylinder range of 1,257 mm, a resolution of 798 dpi is obtained. The laser spot 28 to be used for the illustration must have a length of at least 32 $\mu$m for this resolution.

The necessary laser output for evaporating the moistening agent layer on the ink-transferring surface depends on the layer thickness, the surface velocity of the printing form cylinder 2 and the geometry of the laser spot 28. At a moistening agent layer thickness of 1 $\mu$m and a surface velocity of 3.5 m/sec (radius 200 mm, rotation at a rate of 10,000 revolutions per hour) and a laser spot 28 with a length Ls of 50 $\mu$m and a width Bs of 3 $\mu$m, the laser spot 28 sweeps an area of 50×50 $\mu m^2$ within about 14 $\mu$sec if the shift of the laser array in the longitudinal direction is ignored. With moistening water as the moistening agent, the weight of the water present on such an area is $2.5\times10^{-12}$ kg. To evaporate water, an energy of $2.3\times10^{6}$ J/kg is needed, i.e., $5.8\times10^{-6}$ J per pixel. If the evaporation is to take place in 14 $\mu$sec, an output of 0.41 W is needed. The moistening agent is heated by the printing layer 15 being heated. The efficiency of the laser output depends on the absorption coefficient, the thermal capacity, and the temperature lag of the printing layer 15. The percentage of the laser output that brings about the evaporation of moistening agent in the printing layer 15 should be as high as possible, and it should preferably be at least 0.6 or greater. The laser output per diode is at least about 0.7 W. One-Watt diodes are preferably used.

Since the printing layer 15 has a high temperature in the dried areas on the ink-transferring surface after drying, these areas cannot be moistened immediately, because the moistening agent, flowing in at a low rate only, evaporates immediately on contact with the heated area of the printing layer 15. In order to prevent moistening of the dried area before contact with the inking roller 3 at an especially high level of reliability, the inking roller 3 is arranged directly after the exposure device 20. The pressure of the moistening agent should also be built up only slowly on the ink-transferring surface. If the inking roller 3 is 200 mm behind the exposure device 20 in the direction of rotation of the printing form cylinder 2 in the above example, the time period from the drying to the closing of the pores is 0.06 sec. The moistening agent supply on the rear side of the printing form 12 is set to be such that not more than 0.5 g of moistening agent is fed per $m^2$ of the ink-transferring surface per revolution. Since the moistening agent film is split during each revolution on the inking roller 3 and half of it is removed, a constant film layer thickness of 1 $\mu$m will then become established before the inking roller 3 and 0.5 $\mu$m behind the inking roller 3. The supply of moistening agent is reduced with increasing illustration time corresponding to the surface coverage already reached. Based on water as the moistening agent and a moistening agent layer thickness of 1 $\mu$m, which is to be evaporated, illustration of the printing form cylinder 2, i.e., of two printing forms 12, is possible in about 1 minute. The power consumption of the exposure device 20 is very low in the alternative of the process in which moistening agent is evaporated before to close the pores because the moistening agent layer is very thin.

A triggering electronic unit each is provided per printing form cylinder 2, i.e., per exposure device 20, to generate constant current pulses, whose duration corresponds to the exposure time for one pixel, for each of the 265 diodes. The current intensity is between 1 and 4 A depending on the laser diode being used. The triggering electronic unit also comprises a bit map memory of its own with a storage area of its own, assigned to each diode. The triggering electronic unit also comprises an addressing system for transmitting the bits from the bit map memory to the diodes. The address for the memory is determined from signals from an angle of rotation transmitter of the printing form cylinder 2 or of the rubber blanket cylinder 1 and of a shift transducer, which measures the horizontal shift of the laser array, in which the diode in question is arranged, or presets it for the motor for generating the horizontal movement.

Finally, the triggering electronic unit comprises an interface to a control and buffer unit. The data of associated printing form cylinders 2, preferably of printing form cylinders 2 that work on the same side of the web, are collected in the control and buffer unit. Depending on the transmission and storage capacity, a plurality of printing couples, each with a plurality of printing form cylinders, may be associated with one control and buffer unit.

As was described above, the illustration is performed by an axial shift of the laser array along the rotating printing form cylinder 2. The velocity of the horizontal shift is considerably lower than the speed of the cylinder during the illustration. If a plurality of laser arrays are arranged next to one another in the longitudinal direction of the cylinder, all laser arrays are shifted axially simultaneously, preferably by the same motor. An axial feed of the exposure device 20, which is somewhat smaller than the width of the laser spot 28, takes place during each revolution of the printing cylinder 2. Axially adjacent pixels are therefore slightly overlapped. As a result, the columns of the printing style located next to one another are illustrated one after another, without nonillustrated areas being left between the columns. The width of the overlap of adjacent pixels depends on the sharpness of the imaging of the individual pixel. Blur in the optical imaging and thermal diffusion in the environment of the pixel lead to blur of the exposure, which is compensated by the superimposition during the illustration.

The laser diodes 23 are fastened in the housing 21, grossly adjusted mechanically as a diode line. The light-emitting areas 24 of the laser diodes 23 are imaged onto the printing form 12 by the array of lenses 25. It is ensured by the mechanical gross adjustment of the laser diodes 23 that the geometric deviation of the laser spots 28 on the ink-transferring surface of the printing form 12 does not exceed a defined maximum deviation from the desired positions. A fine adjustment is performed by way of software adjustment.

Figure 7:
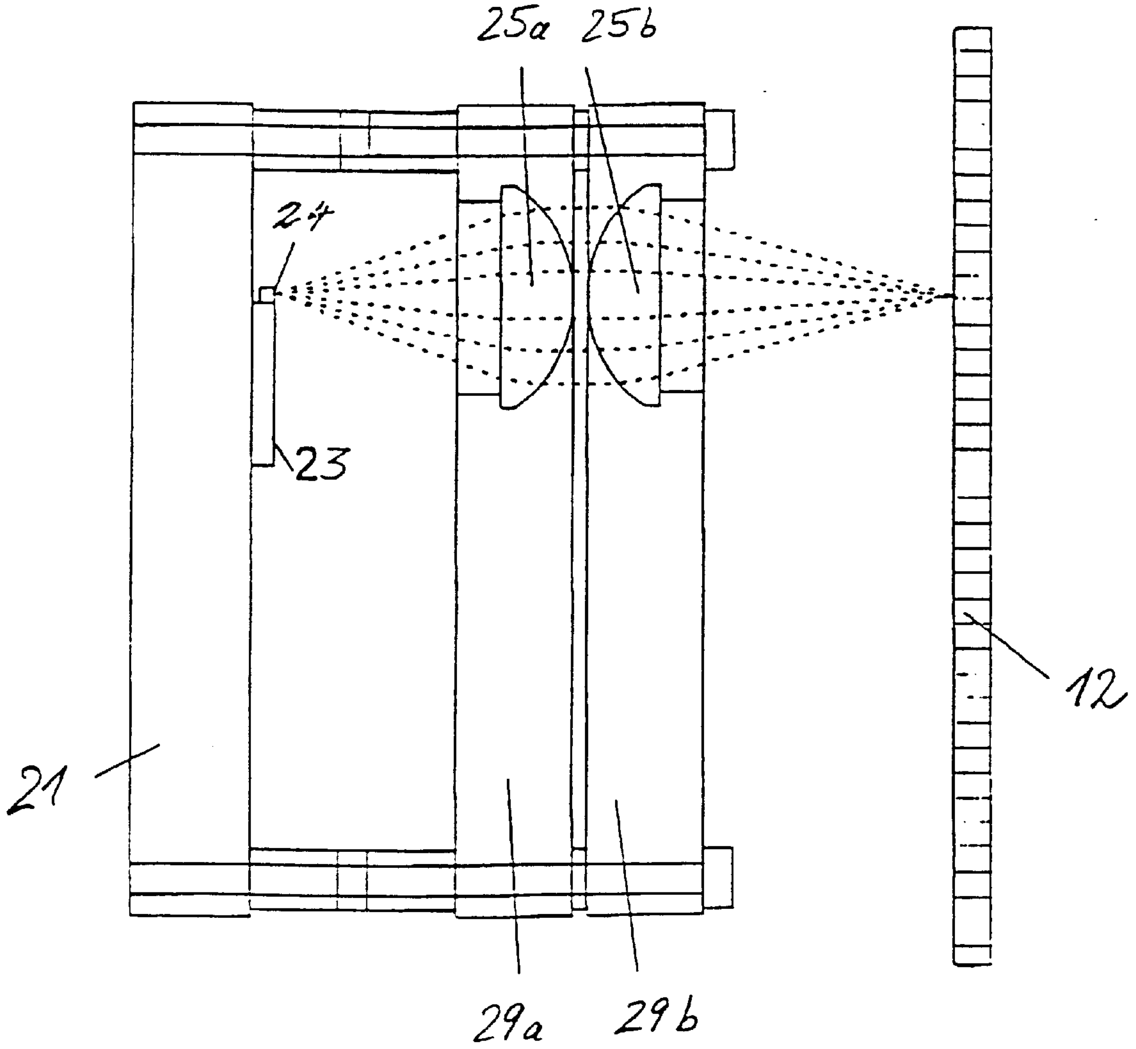
FIG. 7 is a view of an exposure device of another image transfer means.

FIG. 7 shows an exposure device, which is completely identical to the exposure device according to FIGS. 5 and 6 with the exception of the optical imaging means. The optical imaging means of the exposure device according to FIG. 7 is formed for each of the light-emitting areas 24 by two planoconvex lenses 25*a* and 25*b* each. The arched areas of the lenses 25*a* and 25*b* are arranged opposite one another, so that the plane areas of the lenses 25*a* and 25*b* are the areas through which the laser light enters from the light-emitting areas 24 and through which it exits in the direction of the ink-transferring surface of the printing layer 15 from the optical imaging means.

The focal distances of the lenses 25 or 25*a* and 25*b* of the optical imaging means 10, according to FIGS. 5 through 7 are preferably the same for both directions. This is made possible by the narrow strip shape of the light-emitting areas 24. In the exemplary embodiment according to FIG. 7, the manufacturing costs are kept low by the use of identical lenses 25*a* and 25*b*. In particular, planoconvex lenses are less expensive than lenses that must be ground on both sides. The lenses 25*a* and 25*b* can be advantageously obtained by means of two plastic lens arrays, which are arranged with one another, as is shown in FIG. 7, in lens holders 29*a* and 29*b*.

Figure 8:
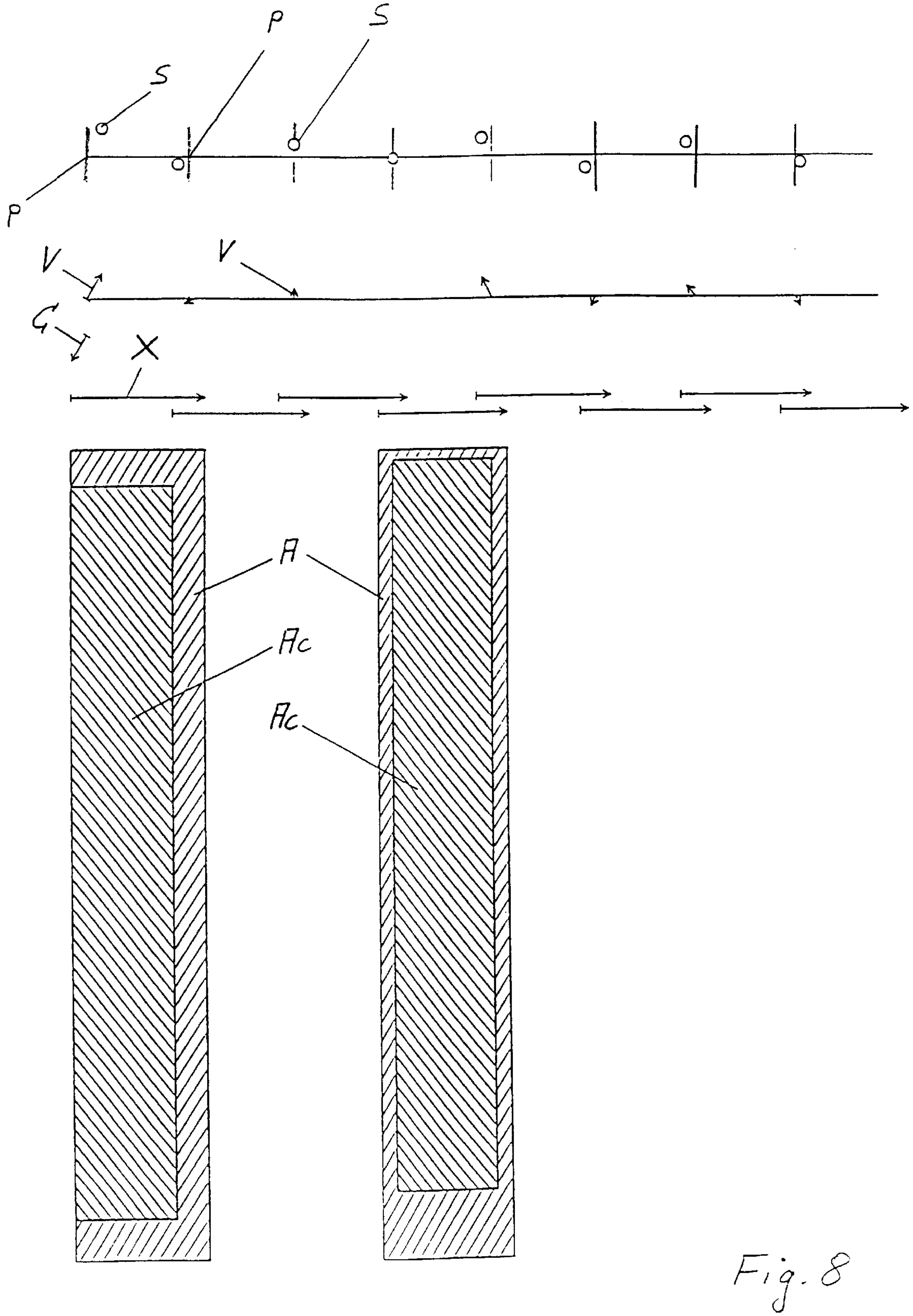
FIG. 8 is a view illustration a software adjustment of the image transfer means according to FIGS. 5 through 7.

FIG. 8 shows the software adjustment for a plurality of laser diodes 23 of a laser array arranged next to one another in a line.

The lines shown in the upper part of FIG. 8 extend in the longitudinal direction of the cylinder. The desired positions P of the laser spots 28 are shown along the topmost line together with the actual positions S of the same laser spots 28 obtained after the mechanical gross adjustment.

The same line is shown again immediately thereunder. The error vector V for each of the laser diodes 23 is shown along this line. Each of the error vectors V is obtained as a straight line connecting the desired position P and the measured actual position S for each of the laser diodes 23. A correction vector C each of equal length and opposite direction, which vector originates from the corresponding desired position P, is formed from the error vectors V. Only the correction vector C for the outer left laser diode 23 of the laser array in FIG. 8 is shown in FIG. 8. The correction vectors C are formed correspondingly for the other laser diodes 23. The shift X by which the laser array is shifted on the whole in the longitudinal direction of the cylinder during the illustration of the printing form cylinder 2 is shown as the third line for each laser diode 23. This shift may take place stepwise after the completion of one revolution of the cylinder, or, what is preferred, continuously during the entire illustration time of the printing form cylinder 2. The shift X is slightly longer than the distance measured in the longitudinal direction of the cylinder between the actual position P and the adjacent laser diodes 23.

An image area Ac, which corresponds to an image strip extending in the circumferential direction of the printing form cylinder 2, is associated with each of the laser diodes 23. The length of this associated image area Ac, measured in the longitudinal direction of the printing form cylinder 2, corresponds to the desired distance between two adjacent laser diodes 23. A memory in the triggering electronic unit is associated with each of the laser diodes 23. This memory is larger than the image area Ac to be transferred. It comprises the so-called illustration area A, which is larger in the longitudinal and circumferential directions of the printing form cylinder 2 by the maximum error tolerance for the mechanical gross adjustment than the image area Ac. If the laser diode 23 has an exact agreement of the actual position S of the laser spot 28 generated by it, the image data of the memory are transmitted for this laser diode 23 into the memory for the illustration. This is the case of the fourth laser diode 23 from the left in FIG. 8. The positioning of its image area Ac in the associated exposure area A is shown in FIG. 8 compared with the outer left laser diode 23. The error vector C of the outer left laser diode 23 has a maximum allowable deviation arising from the gross adjustment in the longitudinal direction of the cylinder. Its image area Ac is correspondingly shifted in the longitudinal direction of the cylinder at the left-hand edge of the associated exposure area A. This shift takes place by a corresponding software addressing of the memory, which is associated with this laser diode 23. The image area Ac, in which the lasering is done, is individually positioned by this software adjustment for each laser diode 23 in the particular associated exposure area A.

The length of each of the exposure areas A measured in the longitudinal direction of the cylinder corresponds to the amount of shift X of the longitudinal shift of the laser array. The width measured in the circumferential direction of the cylinder corresponds to the circumference of the cylinder plus the maximum allowable deviation due to the mechanical gross adjustment. Due to the image areas Ac being shifted by means of software adjustment by the corresponding correction vectors C by a corresponding shift of the address area within the particular associated exposure area, the exact positioning of each of the laser spots 28 on the ink-transferring surface is obtained accurately by mechanical gross adjustment and fine adjustment with software.

While specific embodiments of the invention have been shown and described in detail to illustrate the application of the principles of the invention, it will be understood that the invention may be embodied otherwise without departing from such principles.

What is claimed is:

1. A process for illustrating a printing form for wet offset printing, in which a printing style is produced on an ink-transferring surface of a printing form by forming ink-absorbing and ink-repelling areas, the process comprising for illustration the steps of:

wetting the ink-transferring surface with a moistening agent;

drying in a specific manner the areas of the moistened surface that are to be made into ink-absorbing areas and not drying in a specific manner the areas of the moistened surface that are not to be made into ink-absorbing areas;

uniformly applying a material that absorbs printing ink to the ink-transferring surface with the areas still dry to provide an illustrated printing form; and using the illustrated printed form for an entire production of a newspaper printed product.

2. A process in accordance with claim 1, wherein the material that absorbs printing ink is printing ink that repels moistening agent.

3. A process in accordance with claim 1 wherein the printing form has passage channels for the moistening agent, through which the moistening agent reaches the ink-transferring surface from a rear side of the printing form.

4. The process in accordance with claim 3, wherein the material that absorbs printing ink also repels moistening agent and closes the passage channels in the ink-absorbing areas.

5. The process in accordance with claim 1, wherein a moistening agent film on the ink-transferring surface is set to a uniform thickness in the range of 0.2 $\mu$m to 1 $\mu$m.

6. The process in accordance with claim 1, wherein the areas that are to be made into ink-absorbing areas are irradiated with laser light during the illustration.

7. A process for illustrating a printing form for wet offset printing, in which a printing style is produced on an ink-transferring surface of a printing form by forming ink-absorbing and ink-repelling areas, the process comprising for illustration the steps of:

uniformly applying a flowable material that absorbs printing ink to the ink-transferring surface;

curing the material in a specific manner on the areas that are to be made into ink-absorbing areas; and removing the flowable material from the areas that are to be made into ink-repelling areas by means of a moistening agent.

8. A process in accordance with claim 7, wherein the material that absorbs printing ink is printing ink that repels moistening agent.

9. A process in accordance with claim 7 wherein the printing form has passage channels for the moistening agent, through which the moistening agent reaches the ink-transferring surface from a rear side of the printing form.

10. The process in accordance with claim 9, wherein the material that absorbs printing ink also repels moistening agent and closes the passage channels in the ink-absorbing areas.

11. The process in accordance with claim 7, wherein a moistening agent film on the ink-transferring surface is set to a uniform thickness in the range of 0.2 $\mu$m to 1 $\mu$m.

12. The process in accordance with claim 7, wherein the areas that are to be made into ink-absorbing areas are irradiated with laser light during the illustration.

13. A device for illustrating a printing form of a rotary printing press for wet offset printing, the device comprising:

a printing form cylinder with a printing form;

a moistening means for wetting an ink-transferring surface of said printing form with moistening agent;

an application and image transfer device, with which a printing style with ink-absorbing areas and moistening agent-absorbing areas is produced on the ink-transferring surface by applying a material that absorbs printing ink, including an application device for the uniform application of the material that absorbs printing ink over the ink-transferring surface and an image transfer element, the printing style being produced by the uniform application of printing ink-absorbing material by means of said application device and by specific irradiation of the areas of the ink-transferring surface that are to be made into ink-absorbing areas by an irradiation element of said image transfer element.

14. The device in accordance with claim 13, wherein the application device includes an inking roller.

15. The device in accordance with claim 14, wherein said image transfer element is arranged close to an ink gap, in front of the ink gap, said ink gap being formed by said printing form cylinder and said inking roller, thereby evaporating moistening agent that wets areas that are to be made into ink-absorbing areas.

16. The device in accordance with claim 13, wherein said image transfer element is arranged close to an ink gap, which is formed by said printing form cylinder and said hiking roller, behind the ink gap, in order to cure printing ink that covers areas that are to be made into ink-absorbing areas.

17. The device in accordance with claim 13, wherein said printing form is permeable to moistening agent in a radial direction.

18. The device in accordance with the above claim 13, wherein said printing form has an outer printing layer with capillary pores forming passage channels, which open on the ink-transferring surface and have a mean diameter between 0.1 $\mu$m and 5 $\mu$m.

19. The device in accordance with claim 18, wherein the material of the said printing layer has an open porosity of at least 3% and less than 20%.

20. The device in accordance with claim 18, wherein the capillary pores forming passage channels are closed on the ink-transferring surface of the said printing layer and the printing style is formed as a result on the ink-transferring surface.

21. The device in accordance with claim 13, wherein the said printing form has at least two material layers with different flow resistances for the moistening agent, which said material layers are arranged adjacent to and one on top of another, wherein the material layers, of which there comprise a sublayer and an outer printing layer, and said printing layer forms said ink-transferring surface of said printing form cylinder and has a flow resistance that is several times higher than that of said subjacent sublayer.

22. The device in accordance with claim 21, wherein said sublayer comprises a metal fiber matt.

23. The device in accordance with claim 13, wherein said printing form comprises a layer formed of a material permeable to the moistening agent, which is applied to a perforated printing form carrier adjacent to said layer.

24. The device in accordance with claim 13, wherein said printing form has at least one porous material layer, which is applied to a carrier cylinder or to a plate- or shell-shaped printing form carrier that can be fastened to said carrier cylinder.

25. The device in accordance with claim 13, wherein said irradiation element is directed toward the ink-transferring surface of the said printing form and is formed with laser diode radiator elements.

26. A process for illustrating a printing form for wet offset printing, in which a printing style is produced on an ink-transferring surface of a printing form by forming ink-absorbing and ink-repelling areas, the process comprising for illustration the steps of:

wetting the ink-transferring surface with a moistening agent;

drying in a specific manner the areas of the moistened surface that are to be made into ink-absorbing areas and not drying in a specific manner the areas of the moistened surface that are not to be made into ink-absorbing areas;

uniformly applying a material that absorbs printing ink to the ink-transferring surface with the areas still dry to provide an illustrated printing form, wherein the material that absorbs printing ink is printing ink that repels moistening agent.

27. A process for illustrating a printing form for wet offset printing in which a printing style is produced on an ink-transferring surface of a printing form by forming ink-absorbing and ink-repelling areas, the process comprising for illustration the steps of:

uniformly applying a flowable material that absorbs printing ink to the ink-transferring ice, said flowable material being a printing ink;

curing the material in a specific manner on the areas that are to be made into ink-absorbing areas; and removing the flowable material in areas that are to be made into ink-repelling areas by means of a moistening agent.

28. A device for illustrating a printing form of a rotary printing press for wet offset printing, the device comprising:

a printing form cylinder with a printing form;

a moistening means for wetting an ink-transferring surface of said printing form with moistening agent;

an application and image transfer device, with which a printing style with ink-absorbing areas and moistening agent-absorbing areas is produced on the ink-transferring surface by applying a printing ink material that absorbs printing ink, including an application device for the uniform application of the printing ink material that absorbs printing ink over the ink-transferring surface and image transfer element the printing style being produced by the uniform application of printing ink material that absorbs printing ink by means of said application device and by specific irradiation of the areas of the ink-transferring surface that are to be made into ink-absorbing areas by an irradiation element of said image transfer element.

* * * * *